(12) United States Patent
Norman (10) Patent No.: US 7,171,584 B1
(45) Date of Patent: Jan. 30, 2007

(54) CONNECTOR WITH FAULT TOLERANCE

(75) Inventor: Richard Norman, Sutton (CA)

(73) Assignee: Richard S. Norman, Sutton (CA)

( * ) Notice: Subject to any disclaimer, the term of this patent is extended or adjusted under 35 U.S.C. 154(b) by 556 days.

(21) Appl. No.: 10/677,333

(22) Filed: Oct. 3, 2003

Related U.S. Application Data (60) Provisional application No. 60/415,802, filed on Oct. 4, 2002.

(51) Int. Cl.
*G06F 11/00* (2006.01)

(52) U.S. Cl. ....................................................... 714/13

(58) Field of Classification Search .................. 714/13, 714/20, 25, 47, 16, 43, 56
See application file for complete search history.

(56) References Cited

U.S. PATENT DOCUMENTS

| | | | |
|---|---|---|---|
| 4,722,084 A | 1/1988 | Morton | |
| 5,395,257 A * | 3/1995 | Lein | 439/108 |
| 5,999,097 A * | 12/1999 | Liddle et al. | 340/550 |
| 6,618,783 B1 * | 9/2003 | Hammersley | 710/305 |
| 6,630,747 B1 * | 10/2003 | Kamada et al. | 307/10.1 |

* cited by examiner

*Primary Examiner*—Nadeem Iqbal (57) ABSTRACT

A connector including a first set of signal conducting members realized at least in part on a first surface and a second set of signal conducting members realized at least in part on a second surface, the second set being remote from the first set. In each set, the signal conducting members are arranged generally side by side. The connector also includes a plurality of connection paths, characterized by a layout for interconnecting the first and second sets of discrete signal conducting members such that signals may be exchanged between signal conducting members of the first and second sets. Specific to the invention, each signal conducting member of the first set is provided with connection paths to a different pair of non-contiguous signal conducting members of the second set.

35 Claims, 4 Drawing Sheets

CONNECTOR WITH FAULT TOLERANCE

CROSS-REFERENCE TO RELATED APPLICATION

The present application is based on U.S. provisional patent application No. 60/415,802, filed on Oct. 4, 2002, having the same inventor.

FIELD OF THE INVENTION

The invention relates to integrated circuit terminals, in particular to a connector with built-in fault tolerance.

BACKGROUND OF THE INVENTION

Microelectronic complexes, specifically systems and groups of discrete microelectronic functional modules, implement an important range of electronic devices, including microcomputers and microprocessors, and have important application in the design of electronic systems. Examples of such microelectronic complexes include semiconductor wafers containing a plurality of integrated circuits, as well as integrated circuits containing a plurality of microelectronic components.

An integrated circuit typically contains multiple terminals, these being positions at which a signal connection is established or broken. Connectors are normally used at such terminals to facilitate the signal connection, more particularly to create an interface between discrete circuit components, such as the wires and pins of functional modules, among other possibilities. These connectors are typically formed of at least two sets of signal conducting members, for example two sets of pins, two sets of wires or a set of pins and a set of sockets, where each set is capable to connect to a distinct circuit component.

In the case of a semiconductor wafer, the wafer is typically divided into a plurality of discrete functional cells, each cell including at least one integrated circuit. These cells are laid out within a dedicated area on the wafer face, typically forming a grid-like array. Thus, connectors are used to satisfy both intra-cell and inter-cell signal connection requirements of the wafer, where these connectors are typically fabricated in the semiconductor material of the wafer.

Connectors, whether for use on a semiconductor wafer or in a different type of microelectronic complex, must be manufactured with a high level of precision, in order to ensure precise alignment and the establishment of proper connections between the discrete circuit components to be connected. However, regardless of the level of precision with which connectors are manufactured, there always remains the possibility of connector defects, such as the short-circuiting of a pair of signal conducting members or a faulty wire.

In order to compensate for improper manufacturing tolerances in connectors, it is known to manufacture connectors with built-in fault tolerance. In U.S. Pat. No. 4,722,084, issued to ITT Corporation on Jan. 26, 1988, for which the only named inventor is Steven G. Morton, there is described an array reconfiguration apparatus for use in large integrated circuits and large systems. The apparatus uses spare wires in place of defective wires, and/or spare computation elements in place of defective computation elements, so that an operational system may be created in spite of the occurrence of numerous manufacturing or lifetime faults. The reconfiguration apparatus, or connector, allows for the bypassing of a bad cell in a row of cells, as well as for the circumvention of a bad wire within the connector, through the provision of an interconnection layout that includes spare wires.

However, existing connectors with built-in fault tolerance, including the apparatus described in U.S. Pat. No. 4,722,084, do not compensate for one of the most common fault types arising during the manufacture and use of connectors, that being a pair of fused or short-circuited signal conducting members within the connector. Unfortunately, such a fault, if undetected, may result in improper signal connections, and thus faulty signal exchanges, between discrete circuit components. If detected, such a fault may require the repair or replacement of a connector, which may increase the fabrication time and/or the cost associated with the manufacturing process.

Against this background, it clearly appears that a need exists in the industry for the development of a connector with improved fault tolerance.

SUMMARY OF THE INVENTION

According to a broad aspect, the invention provides a novel connector including first and second sets of signal conducting members. The first set is realized at least in part on a first surface, while the second set is realized at least in part on a second surface, the second set being remote from the first set. In each set, the signal conducting members are arranged generally side by side. The connector also includes a plurality of connection paths, characterized by a layout for interconnecting the first and second sets of discrete signal conducting members such that signals may be exchanged between signal conducting members of the first and second sets. Specific to the invention, each signal conducting member of the first set is provided with connection paths to a different pair of non-contiguous signal conducting members of the second set.

Advantageously, the novel connector of the present invention is capable to compensate for different types of faults in the signal conducting members of the connector. In particular, even if a pair of neighboring signal conducting members of the connector are identified as being faulty, the layout of the connection paths of the connector allows for all required signal connections to be re-routed, and thus established, through the connector.

In a specific, non-limiting example of implementation, the connector is fabricated on a semiconductor wafer. The connector includes first and second sets of signal conducting members, each set arranged on a surface of the wafer. In both the first and second sets of signal conducting members, the signal conducting members are arranged side by side. The sets of signal conducting members are positioned on the wafer such that the sets form two substantially parallel rows. The second set of signal conducting members includes at least two more signal conducting members than the first set of signal conducting members, thus providing the connector with "spare" signal conducting members. Note that, on a semiconductor wafer, the signal conducting members of the first and second sets may take various different forms, including for example traces and vias, among many other possibilities.

Note that the connector may be characterized by a planar arrangement, in which both sets of signal conducting members are arranged on the same surface or layer of the wafer body.

Each signal conducting member of the first set is provided with a main connection path to a first signal conducting member of the second set and an alternate connection path to a second signal conducting member of the second set, where the first and second signal conducting members of the second set are non-contiguous in the row of signal conducting members of the second set. These connection paths correspond to predetermined routes over which signals may be exchanged between the signal conducting members of the first set and the signal conducting members of the second set. During manufacturing of the connector, all or a subset of the plurality of connection paths may be realized by physical connection lines or wires. Note that each signal conducting member of the first set is associated with a different pair of first and second signal conducting members of the second set.

During the application of a connector to interconnect cells or discrete circuit components, the signal conducting members of the second set are tested for faults. On the basis of the test results, one of the main and alternate connection paths is selected for each signal conducting member of the first set of signal conducting members. More specifically, when the connector is in use, each signal conducting member of the first set is connected to a single signal conducting member of the second set, via either one of the corresponding main connection path and alternate connection path.

In other advantages, the connector offers variable connectivity, more specifically the possibility of switching between main and alternate connection paths, thus providing a greater degree of freedom for interconnecting discrete circuit components. Further, the specific layout of the connection paths in the connector, and in particular the possibility of having spare signal conducting members within the connector, offers sufficient redundancy to establish more secure intercommunications between, for example the cells of a semiconductor wafer or the discrete components of an integrated circuit.

In a variant example of implementation, two or more connectors may be coupled together to form a connector combination, in order to provide for different types of inter-cell and intra-cell signal interconnection. In one example, such a combination of connectors may allow for the interconnection of two sets of cells, where both sets are limited to the same number of cells.

In another variant example of implementation, the connector is implemented on a chip, for interconnecting an integrated circuit of the chip with the pins that connect the chip to a circuit board. The connector may also be implemented on a printed circuit board (PCB) or a different type of microelectronic complex.

According to another broad aspect, the invention provides a combination of the above-described connector and a control mechanism. The control mechanism is operative to select, for each signal conducting member of the first set, one of the associated connection paths. Thus, the control mechanism establishes a signal connection between each signal conducting member of the first set and a particular one of the respective pair of non-contiguous signal conducting members of the second set.

According to yet another broad aspect, the invention provides a method for fabricating a connector on a semiconductor body.

According to a further broad aspect, the invention provides a method for connecting a first set of discrete signal conducting members, realized at least in part on a first surface, to a second set of discrete signal conducting members, realized at least in part on a second surface, the second set of signal conducting members being remote from the first set. The signal conducting members in the first set are arranged generally side by side according to a first order. Similarly, the signal conducting members in the second set are arranged generally side by side according to a second order, each of the first and second orders being characterized by a series of positions. The method includes the step of providing, for each signal conducting member of the first set, a main connection path to a first signal conducting member of the second set and an alternate connection path to a second signal conducting member of the second set, the first and second signal conducting members of the second set occupying non-successive positions in the second order. Each signal conducting member of the first set is thereby associated with a different pair of first and second signal conducting members of the second set. The method also includes the step of, for each signal conducting member of the first set, testing each one of the respective first and second signal conducting members of the second set for a fault. Next, for each signal conducting member of the first set, one of the respective main and alternate connection paths is selected on the basis of the test results, such that each signal conducting member of the first set is connected to a single signal conducting member of the second set.

BRIEF DESCRIPTION OF THE DRAWINGS

These and other features of the present invention will become apparent from the following detailed description considered in connection with the accompanying drawings, of which.

In the drawings, embodiments of the invention are illustrated by way of example. It is to be expressly understood, however, that the drawings are provided only for purposes of illustration and as an aid to understanding, and are not intended to be a definition of the limits of the invention, for which reference should be made to the appending claims.

DETAILED DESCRIPTION

Figure 1:
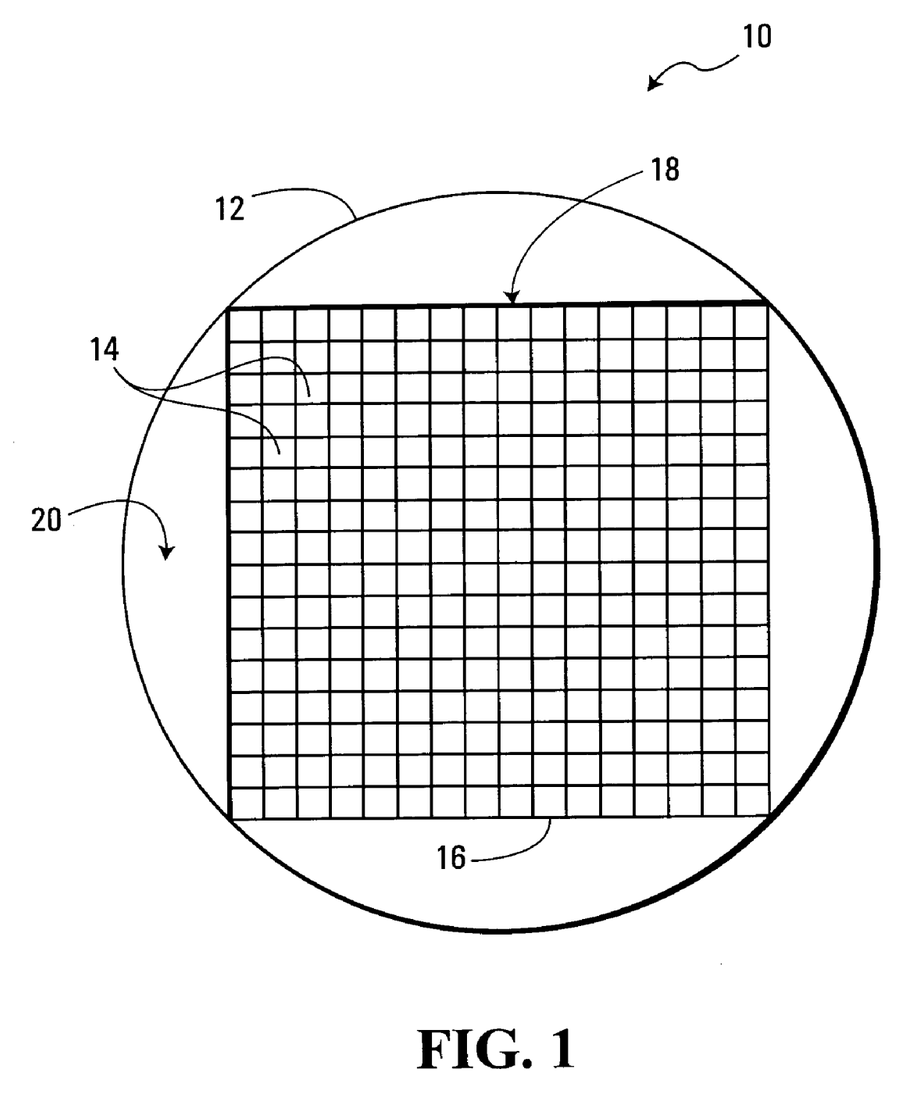
FIG. 1 is a top view of an example of a semiconductor wafer.

FIG. 1 is a top view of a semiconductor wafer 10, one example of a typical microelectronic complex. The wafer 10 is formed of a body of semiconductor material 12 and contains a plurality of discrete functional modules 14, also referred to as cells. In this particular example of a microelectronic complex, each discrete functional module 14 includes at least one integrated circuit.

Note that in other examples of microelectronic complexes, such as the integrated circuit itself, the discrete functional modules of the microelectronic complex include the electronic components of the integrated circuit.

The wafer body of semiconductor material 12 is made of any suitable material that has the requisite electrical properties and mechanical strength, such as silicon, germanium or gallium arsenide, and may be of any size or shape. In the example of FIG. 1, the semiconductor material of wafer body 12 is silicon, the body 12 characterized by a circular shape as a result of the cylindrical shape of the silicon crystal from which the wafer 10 was sliced. Typically, body 12 would be 10 to 30 cm in diameter and less than 1 mm thick.

The methods and techniques used to form integrated circuits in the material of body 12, as well as to create multiple layers or surfaces of circuit patterns on the body 12, have been well documented and are well known in the art. Accordingly, these methods and techniques, such as oxidation, photolithography, etching, diffusion, ion implantation and chemical vapor deposition, will not be described in further detail.

The cells 14 of the wafer 10 are dispersed within a dedicated area 16 of the body 12. Alternatively, the discrete functional modules 14 may be dispersed across the entire surface area of body 12. In the example of FIG. 1, the cells 14 are shown laid out within the dedicated area 16 in a structured array 18, where the cells 14 are all adjacent one another and each cell 14 is of the same size and occupies substantially the same amount of space. Alternatively, the cells 14 could be spaced apart from each other within the array 18, and could be of different sizes and occupy different amounts of space.

The wafer 10 has first and second faces, where the first face 20, also referred to as the main face, is shown in FIG. 1. Although not shown in FIG. 1, on this first face 20 are mounted a plurality of Input/Output (I/O) signal conducting members for connection to an external substrate, such as a circuit board. Examples of signal conducting members include connectors, solder bumps, pins and wires, among other possibilities. These signal conducting members are characterized by a high level of conductivity for transmitting signals between the discrete functional modules 14 of the wafer 10 and the external substrate, where such signals may include electrical and/or optical signals. Alternatively, the signal conducting members may be mounted on the second face (not shown in FIG. 1) of the wafer 10.

The semiconductor wafer 10 contains a plurality of connectors for providing intra-cell and inter-cell connectivity between integrated circuit components. More specifically, the connectors permit the exchange of signals within and between the cells 14 of the wafer 10. Examples of such signals include electric signals and optical signals. These connectors are formed on one or more layers of the wafer 10 where a circuit terminal exists and an interface is required to establish a signal connection between discrete circuit components. In addition to horizontal connectors across each layer of the wafer 10, the wafer 10 may include vertical connectors extending between different layers of the wafer 10.

Note that the connectors may be formed in the semiconductor material of the wafer body 12 using the same methods and techniques as those used to form the integrated circuits.

In one example, the connectors are fabricated using reticles. A reticle is a sheet of material on which a pattern is formed, for example a pattern of the wiring between two cells, for use in executing a photolithography exposure treatment of the semiconductor material, which is usually coated with a protective resist. During this exposure treatment, the pattern formed on the reticle is transcribed onto the wafer 10. Thus, during the manufacturing process of wafer 10, a plurality of different reticles are used to realize inter-cell wiring, intra-cell wiring, data buses and connectors, among other possibilities.

A connector of the wafer 10 includes at least two sets of signal conducting members, each set formed on a surface or layer of the wafer 10. Each set is associated with a different integrated circuit component or cell 14 to be interconnected by the connector. Examples of such signal conducting members include wires, solder bumps, traces and vias, among other possibilities. Each signal conducting member of each set is adapted to engage a corresponding signal conducting member of the associated integrated circuit component or cell 14, for establishing a signal connection.

Alternatively, a connector may be a discrete entity, formed on a dedicated body of suitable material, separate from the wafer body 12. Possible types of connector material include both semiconductor material and insulating material, in dependence of the specific application, and thus requirements, associated with the connector. In a specific example, the connector may be contained in a chip. A particular manufacturing process may be designed and implemented to produce a plurality of such connector chips, where one such chip may be mounted to wafer 10 wherever a connector is required.

Note that connectors on the wafer 10 allow the exchange of signals conveying different types of information between the various circuit components of the wafer 10. Examples of such different types of information include data, memory addresses and control data, among other possibilities.

Figure 2:
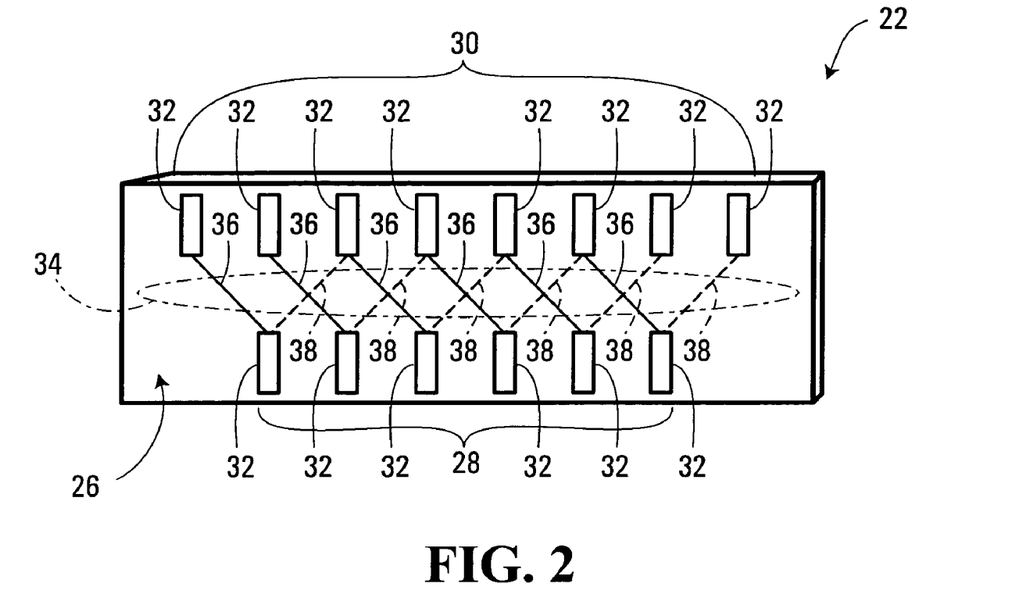
FIG. 2 illustrates a connector, according to an example of implementation of the present invention.

In a specific, non-limiting example of implementation of the present invention, a connector includes two sets of discrete signal conducting members, as shown in FIG. 2. The connector 22 includes a first set of signal conducting members 28 and a second set of signal conducting members 30, both realized on a layer 26 of the wafer 10. In this example, the connector 22 is characterized by a planar arrangement, both sets of signal conducting members being realized on the same surface or layer of the wafer 10.

Within each set 28, 30, the signal conducting members 32 are arranged generally side by side, such that the sets 28, 30 form two parallel rows on the surface 26 of the wafer 10. Alternatively, the signal conducting members 32 of each set 28, 30 may be characterized by various different layouts and configurations.

In the example shown in FIG. 2, the first set of signal conducting members 28 includes six signal conducting members 32, while the second set of signal conducting members 30 includes eight signal conducting members 32. It is important to note that each of sets 28 and 30 may include more or less signal conducting members 32, since different numbers of signal conducting members 32 are required per connector 22 in dependence of the intended application of the connector 22.

A plurality of connection paths 34 are defined by the connector 22, for interconnecting the first and second sets of signal conducting members 28 and 30, respectively. These connection paths 34 are characterized by a specific layout and correspond to predetermined routes over which signals may be exchanged between the signal conducting members 32 of the first set 28 and the signal conducting members 32 of the second set 30. During manufacturing of the connector 22, all or a subset of the plurality of connection paths 34 may be realized by physical connection lines or wires, as will be described in further detail below.

Specific to the present invention, the second set of signal conducting members 30 includes at least two more signal conducting members 32 than the first set of signal conducting members 28, thus providing the connector 22 with "spare" signal conducting members 32. Accordingly, the layout of connection paths 34 is such that each signal conducting member 32 of the first set 28 is provided with two different connection paths 34 to two different signal conducting members 32 of the second set 30, where these two different signal conducting members 32 of the second set 30 are not immediately adjacent each other in the row of the second set 30. Each signal conducting member 32 of the first set 28 is thus associated with a different pair of non-contiguous signal conducting members 32 of the second set 30.

Advantageously, by ensuring that each signal conducting member 32 of the first set of signal conducting members 28 has two possible connection paths to two different, non-contiguous signal conducting members 32 of the second set 30, the connector 22 is capable to compensate for a fault in any one of the signal conducting members 32 of the second set 30, as well as for the short-circuiting of any two adjacent signal conducting members 32 of the second set 30. More specifically, in the case of either type of fault, each signal conducting member 32 of the first set 28 can still be connected, via one of its main or alternate connection paths 36, 38, to a non-defective signal conducting member 32 of the second set 30.

The layout of the connection paths 34 of the connector 22 is computed on the basis of a predetermined algorithm, where many different algorithms are possible without departing from the scope of the present invention.

In the example shown in FIG. 2, the second set of signal conducting members 30 includes two more signal conducting members 32 than the first set 28, such that the connector 22 has two spare signal conducting members 32. Each signal conducting member 32 of the first set 28 is provided with a main connection path 36 to a first signal conducting member 32 of the second set 30 and an alternate connection path 38 to a second signal conducting member 32 of the second set 30, where these first and second signal conducting members 32 of the second set 30 are separated by an intermediate signal conducting member 32.

Figure 3:
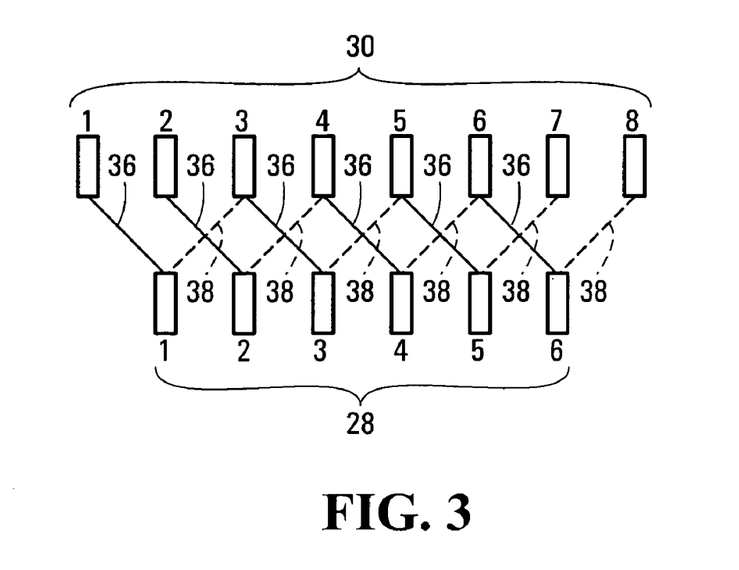
FIG. 3 illustrates the connection paths of the connector shown in FIG. 2.

With reference to FIG. 3, the first set of signal conducting members 28 is characterized by a first order of six positions, numbered 1 to 6, while the second set of signal conducting members 30 is characterized by a second order of eight positions, numbered 1 to 8. The layout of the main and alternate connection paths 36, 38 is computed on the basis of the following algorithm, in which variable POS is used to represent a position within the first order of the set 28, variable MPOS is used to represent the position within the second order of the set 30 to which the main connection path is connected, variable APOS is used to represent the position within the second order of the set 30 to which the alternate connection path is connected and N=6.

for $1 \leq POS \geq N$
{
MPOS=POS
APOS=POS+2
}

During the fabrication of connector 22, all or only a subset of the plurality of connection paths 34 may be permanently realized in the semiconductor material of wafer 10 by physical connection lines or wires, on the basis of the requirements to be met by the connector 22. Various different subsets of the connection paths 34 may be realized in order to meet the different requirements. Examples of such requirements include a level of manufacturing defect compensation, a level of redundancy as well as a level of variable connectivity.

Built into the wafer 10 is a control mechanism associated with the connector 22, for controlling the selection of the main and alternate connection paths 36, 38 for each signal conducting member 32 of the first set of signal conducting members 28. Typically, the various different components of the control mechanism are formed in one or more layers of the wafer 10, during the wafer fabrication process.

During the application of a connector 22 to interconnect cells 14 or discrete circuit components, for instance at post-manufacturing time, the control mechanism is operative to test the signal conducting members 32 of the second set of signal conducting members 30 for defects or faults. In one example, the testing of signal conducting members 32 is conducted by applying a known pattern of binary signals to the signal conducting members 32 and reading the signals output therefrom. On the basis of the test results, which should reveal any short circuits or other defects among the signal conducting members 32, one of the main and alternate connection paths 36, 38 is selected by the control mechanism for each signal conducting member 32 of the first set of signal conducting members 28. Thus, when the connector 22 is in use, each signal conducting member 32 of the first set 28 is connected to a single signal conducting member 32 of the second set 30, via either one of the corresponding main connection path 36 and alternate connection path 38.

Since fault testing of connector signal conducting members is well known to those skilled in the art, and has been well documented, this concept will not be described in further detail.

If no faults are detected in any one of the signal conducting members 32 of the second set 30, the main connection path 36 is selected for each signal conducting member 32 of the first set 28.

If a fault is detected in a particular signal conducting member 32 of the second set 30, or in two contiguous signal conducting members 32 of the second set 30, the selection of main connection path 36 or alternate connection path 38 for each signal conducting member 32 of the first set 28 is performed such that no signal conducting member 32 of the first set 28 is connected to the particular faulty signal conducting member(s) 32 of the second set 30.

In particular, if a fault is detected in a signal conducting member 32 of the second set 30, the particular signal conducting member 32 of the first set 28 which is provided with a main connection path 36 to the faulty signal conducting member 32 of the second set 30 becomes a reference point for the selection process. More specifically, the main connection path 36 is selected for each signal conducting member 32 of the first set 28 preceding the particular signal conducting member 32 in the first order, while the alternate connection path is selected for the particular signal conducting member 32 as well as for each signal conducting member 32 succeeding the particular signal conducting member 32 in the first order. Thus, no signal conducting member 32 of the first set 28 is connected to the faulty signal conducting member 32 of the second set 30.

The selection of one of the main and alternate connection paths 36, 38 for a signal conducting member 32 of the first set 28 by the control mechanism may involve the permanent disconnection of a physical connection line or wire realizing a connection path 34, such that the connection path 34 is no longer operative to conduct signals between a signal conducting member 32 of the first set 28 and a signal conducting member 32 of the second set 30. In a specific example, the permanent disconnection of a physical connection line or wire may be implemented with a fuse or an anti-fuse, among other possibilities.

Alternatively, the selection process may involve the activation of a physical connection line or wire, such that the selected connection path 34 is operative to conduct signals between a signal conducting member 32 of the first set 28 and a signal conducting member 32 of the second set 30. The selection process may also involve the deactivation of a physical connection line or wire, such that a particular connection path 34 is temporarily incapable of conducting signals.

In a specific example, the control mechanism includes a control logic circuit and a plurality of 1-bit registers. Each register is associated with a respective signal conducting member 32 of the first set 28 and controls two gates, each gate coupled to one of the respective main and alternate connection paths 36, 38. When the control logic sets the register to 1, the main connection path 36 is activated, while the alternate connection path 38 is deactivated. Similarly, when the control logic sets the register to 0, the alternate connection path 38 is activated, while the main connection path 36 is deactivated. The control logic sets the registers according to a mask that is determined at power-up time, where this mask is determined at post-manufacturing time on the basis of the fault testing described above. In this particular example, the connector 22 is capable to provide variable connectivity, in addition to defect compensation. More specifically, since no connection path 34 is ever permanently disabled and the control mechanism is capable to selectively activate or deactivate each control path 34 of the connector 22, the connectivity provided by the connector 22 becomes dynamically variable, and may be varied by the control mechanism in order to suit different applications.

Note that the control mechanism may be implemented in a variety of different ways, without departing from the scope of the present invention. Such control mechanisms are well known in the prior art and have been well documented. Accordingly, the functionality and implementation of the control mechanism will not be described in any further detail.

In a non-limiting example of implementation, assume that the connector 22 is to be fabricated on a particular layer of the wafer 10, at a predetermined location, over several stages of the manufacturing process of the wafer 10, and that this connector 22 is to provide manufacturing defect compensation. Since in this example the connector 22 is to be formed on a single layer of the wafer 10, the layout of the connection paths is characterized by a planar arrangement.

A reticle is first designed for use in transcribing the pattern of the connector 22, including the signal conducting members 32 and the connection paths 34, onto the particular layer of the wafer 10. The reticle pattern is designed such that, during the exposure treatment of the semiconductor material of wafer 10 using the reticle, all of the connection paths 34 of connector 22 are etched into the material of the wafer 10. Next, the signal conducting members 32 of the connector 22 are realized by diffusion or doping processes, among other possibilities. Similarly, the interconnections across the particular layer of the wafer 10 are formed by depositing one or more layers of a conducting metal, such as aluminum, onto the particular layer of the wafer 10. Lithography and etching processes are then used to remove unwanted metal and leave microscopically thin lines of metal interconnects. By these processes, all or a subset of the connection paths 34, including main connection paths 36 and alternate connection paths 38, may be permanently realized on the wafer 10 with physical connection wires.

Note that, in this specific example of implementation, since the connector 22 is to provide defect compensation, main connection paths 36 and alternate connection paths 38 are initially all permanently realized on the wafer body 12 with physical connection wires.

Figure 4:
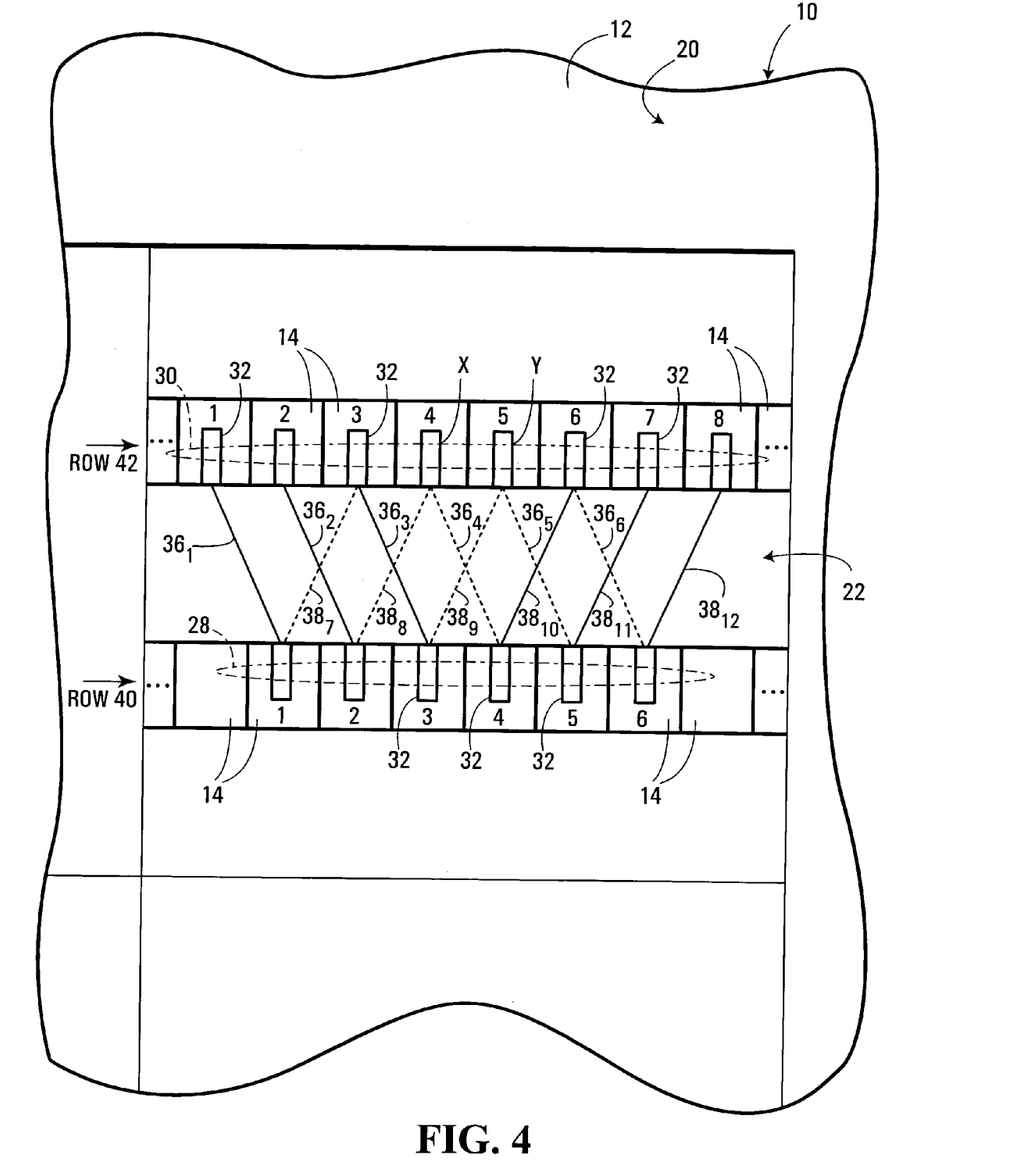
FIG. 4 illustrates use of the connector shown in FIG. 2 to interconnect cells of the wafer shown in FIG. 1.

With reference to FIG. 4, at a later stage in the manufacturing process of the wafer 10, the previously formed connector 22 is to be applied by the associated control mechanism of wafer 10 to establish six cell connections between the cells 14 of cell rows 40 and 42. Assume that each cell has a dedicated signal conducting member (not shown in FIG. 4), such as a wire, for engagement with the signal conducting members 32 of the connector 22, in order to establish a signal connection.

Note that, in one example, the engagement between the signal conducting member of each cell 14 and the respective signal conducting member 32 of the connector 22 is effected by a soldering process. Alternatively, during the manufacturing process, the signal conducting members 32 of the connector 22 may be laid down on top of the signal conducting members of the cells 14, such that the signal connection is established without the need for soldering or any other such engagement technique.

In order to interconnect six pairs of the neighboring cells 14 in cell rows 40 and 42 with connector 22, one of the main and alternate connection paths 36, 38 for each signal conducting member 32 of the first set 28 must be selected by the control mechanism. This selection is performed by first testing each signal conducting member 32 of the second set 30 for faults. In one example of fault testing, the control mechanism attempts to identify any signal conducting members 32 that may be fused together, by applying an alternating pattern of binary signals to the signal conducting members 32.

Assume that, during the testing of the second set of signal conducting members 30, the control mechanism detects that the signal conducting members at positions 4 and 5 in the second order of the second set 30, notably signal conducting members X and Y, are fused together, and thus faulty. Accordingly, the control mechanism selects main connection paths $36_1$, $36_2$ and $36_3$ for the signal conducting members 32 of the first set 28 located at positions 1–3 in the first order, while the alternate connection paths $38_{10}$, $38_{11}$, $38_{12}$ are selected for the signal conducting members 32 of the first set 28 located at positions 4–6 in the first order. Thus, six cell connections are established between cell rows 40 and 42, while avoiding the use of faulty signal conducting members X and Y.

Since all of the connection paths 34 of the connector 22 are permanently realized by connection wires, the selection of one of a pair of main and alternate connection paths 36, 38 by the control mechanism involves the disconnection of the other one of the pair. In this specific example, the disconnection of a particular connection path 34 is permanent and involves the activation of a fuse (not shown in FIG. 4) coupled to the corresponding physical connection wire by the control mechanism. Thus, the alternate connection paths $38_7$, $38_8$ and $38_9$, as well as the main connection paths $36_4$, $36_5$, $36_6$ are disconnected by activating fuses coupled to the corresponding physical connection wires.

In a variant example of implementation, two or more connectors 22 may be coupled together to form a connector combination, in order to provide for different types of inter-cell and intra-cell signal interconnection. In one example, such a configuration of connectors 22 may allow for the interconnection of two sets of cells 14, where each set is characterized by the same number of cells 14. Thus, there are no spare cells for providing defect compensation should one or more of the cells 14 be identified as being faulty.

Figure 5:
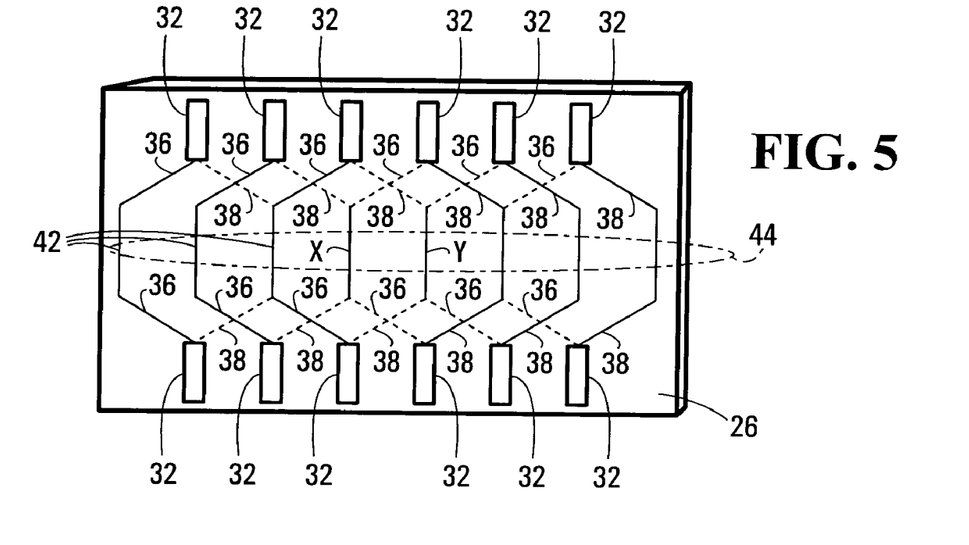
FIG. 5 illustrates a use of two connectors coupled together for interconnecting cells of the wafer shown in FIG. 1, according to an example of implementation of the present invention.

In the example shown in FIG. 5, two connectors 22 have been coupled together by the intermediary of a set 44 of eight signal conducting members 42, in this example wires. Accordingly, this configuration includes two sets of main connection paths 36 and two sets of alternate connection paths 38.

It is important to note that, as in the previous example of implementation, the connectors 22 may include more or less than six signal conducting members 32, since different numbers of signal conducting members 32 may be required in dependence of the intended application. Specific to the present invention, the set 44 of intermediary wires 42 includes two more wires 42 than the number of connector signal conducting members 32. Accordingly, the layout of main and alternate connection paths 36, 38 is such that each signal conducting member 32 is provided with two different connection paths to two different intermediary wires 42, where these two different wires 42 are not immediately adjacent each other in the row of wires 42.

The connector combination shown in FIG. 5 allows for the compensation of a fault in any one of the intermediary wires 42, as well as of the short-circuiting of any two adjacent wires 42. Furthermore, such a configuration permits to compensate for faulty signal conducting members 32 and/or cells 14 that may be in engagement with these signal conducting members 32, presuming that the number of signal conducting member and/or cell connections that need to be made by the connector configuration is less than the number of signal conducting members 32 in each connector 22, in this case less than six.

Depicted in the example shown in FIG. 5 is one way of using the connector combination to compensate for the detection of a pair of wires 42 that are fused together, identified as wires X and Y. The selected main and alternate paths 36, 38 are shown in solid line, where these selections allow the establishment of six interconnections between the signal conducting members 32 of the two connectors 22, while avoiding the wires X and Y. The connection paths 36, 38 shown in dotted line represent the paths that would be disconnected, either permanently or temporarily, prior to application of the connector combination.

Figure 6:
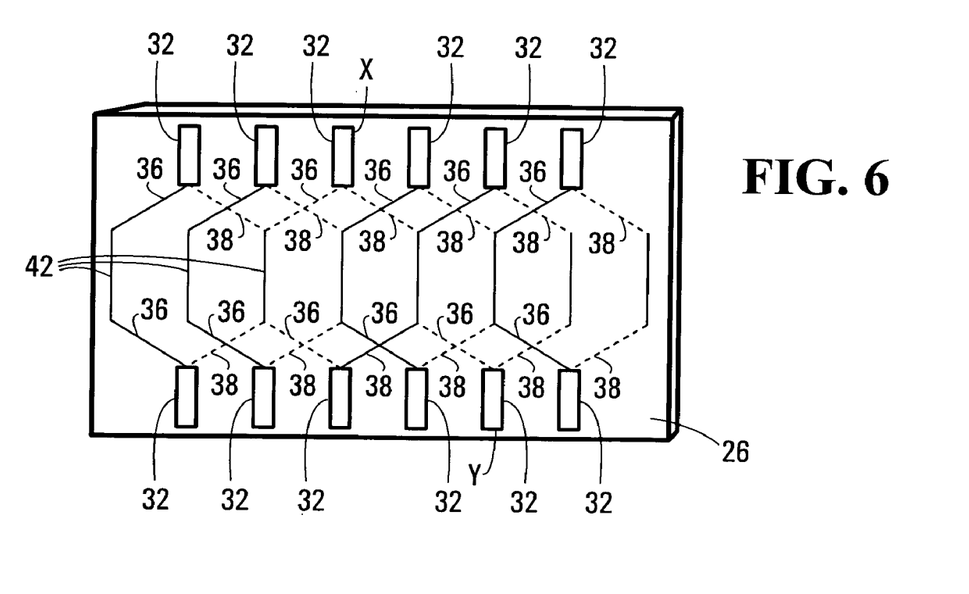
FIG. 6 illustrates a variant use of two connectors coupled together for interconnecting cells of the wafer shown in FIG. 1, according to an example of implementation of the present invention.

In another example, assume that the intended application for the six-signal conducting member connector combination requires only five interconnections between the signal conducting members 32 of the two connectors 22. Accordingly, depicted in FIG. 6 is another way of using the connector combination, in this case to compensate for the detection of two faulty signal conducting members 32, identified as signal conducting members X and Y. The selected main and alternate paths 36, 38 are shown in solid line, where these selections allow the establishment of five interconnections between the signal conducting members 32 of the two connectors 22, while avoiding the faulty signal conducting members X and Y. The connection paths 36, 38 shown in dotted line represent the paths that would be disconnected, either permanently or temporarily, prior to application of the connector combination.

In the above examples, the connector 22 has been described as providing manufacturing defect tolerance as well as variable connectivity. However, it is important to note that the same connector 22 may be used to provide redundancy within the microelectronic complex of wafer 10. Take for example the connector 22 shown in FIG. 4. When this connector 22 is in use for a specific application and few or no faults are detected during the testing of the signal conducting members 32 of the second set 30, certain signal conducting members 32 of the second set 30 may be considered spare and thus available for alternative uses. One example of such an alternative use is the transmission of back-up signals, where a back-up signal is essentially a copy of a signal being sent over another connection path. In the latter case, connection paths 34 connected to the spare signal conducting members 32 that would normally be deactivated or disconnected would remain active and in use for the redundant transmission of signaling information. In another example, the spare signal conducting members 32 may be used to transmit control information, among other possibilities.

Although the connector 22 of the above examples has been described for use on a semiconductor wafer, it is important to note that, under the present invention, the connector 22 may be adapted for use in many different types of microelectronic complexes. In particular, the principles and structure of the above-described connector may also be applied to connectors on chips and to connectors on printed circuit boards (PCBs). Taking the example of a chip, such a connector may be used to establish signal connections from an integrated circuit on the chip to a set of pins connecting the chip to a circuit board. In this case, terminals of the integrated circuit act as the first set of signal conducting members of the connector, while the pins act as the second set of signal conducting members of the connector, the connection paths and the control mechanism being implemented inside of the chip.

Although several embodiments have been illustrated, this was for the purpose of describing, but not limiting, the invention. Various modifications will become apparent to those skilled in the art and are within the scope of this invention, which is defined more particularly by the attached claims.

The invention claimed is:

1. A connector comprising:
    a) a first set of discrete signal conducting members realized at least in part on a first surface, the signal conducting members in said first set being arranged generally side by side;
    b) a second set of discrete signal conducting members realized at least in part on a second surface, said second set being remote from said first set, the signal conducting members in said second set being arranged generally side by side;
    c) a layout of connection paths for interconnecting said first and second sets of discrete signal conducting members such that signals may be exchanged between signal conducting members of said first and second sets, each signal conducting member of said first set being provided with connection paths to a different pair of non-contiguous signal conducting members of said second set.

2. A connector as defined in claim 1, wherein each signal conducting member of said second set belongs to at most two different pairs of non-contiguous signal conducting members of said second set.

3. A connector as defined in claim 2, wherein each signal conducting member of said first set is provided with a main connection path to a first signal conducting member of said second set and an alternate connection path to a second signal conducting member of said second set, said first and second signal conducting members of said second set being non-contiguous in said second set, said first signal conducting member of said second set being different for each signal conducting member of said first set, said second signal conducting member of said second set being different for each signal conducting member of said first set.

4. A connector as defined in claim 3, wherein the signal conducting members of said second set are arranged according to a certain order, the certain order characterized by a series of positions, each different pair of non-contiguous signal conducting members of said second set occupying a different pair of unsuccessive positions in said certain order.

5. A connector as defined in claim 4, wherein said first set of signal conducting members includes N signal conducting members and said second set of signal conducting member includes N+2 signal conducting members, said certain order being characterized by N+2 positions.

6. A connector as defined in claim 5, wherein when said first signal conducting member of said second set occupies position X in said certain order, said second signal conducting member of said second set occupies position X+2 in said certain order.

7. A connector as defined in claim 5, wherein the signal conducting members of said first set are arranged according to a first order and the signal conducting members of said second set are arranged according to a second order, the layout of the main and alternate connection paths for each signal conducting member of said first set being computed as follows:

For $1 \leqq POS \geqq N$
{
  MPOS=POS
  APOS=POS+2
}
where:
POS is the position in the first order of the signal conducting member of the first set;
MPOS is the position in the second order to which the main connection path is connected;
APOS is the position in the second order to which the alternate connection path is connected.

8. A connector as defined in claim 1, wherein said connector further includes at least one semiconductor body defining said first and second surfaces.

9. A connector as defined in claim 8, wherein said semiconductor body includes multiple layers, said first surface corresponding to a particular layer of said semiconductor body.

10. A connector as defined in claim 9, wherein said second surface corresponds to the same particular layer of said semiconductor body.

11. A connector as defined in claim 1, wherein said signal conducting members are selected from the group consisting of wires, solder bumps, traces and vias.

12. A connector as defined in claim 1, wherein said signals are electric signals.

13. A connector as defined in claim 1, wherein said signals are optical signals.

14. In combination:
a) a connector including:
  i) a first set of discrete signal conducting members realized at least in part on a first surface, the signal conducting members in said first set being arranged generally side by side;
  ii) a second set of discrete signal conducting members realized at least in part on a second surface, said second set being remote from said first set, the signal conducting members in said second set being arranged generally side by side;
  iii) a layout of connection paths for interconnecting said first and second sets of discrete signal conducting members such that signals may be exchanged between signal conducting members of said first and second sets, each signal conducting member of said first set being provided with connection paths to a different pair of non-contiguous signal conducting members of said second set;
b) a control mechanism operative to select, for each signal conducting member of said first set, one of the associated connection paths for establishing a signal connection between the signal conducting member of said first set and a particular one of the respective pair of non-contiguous signal conducting members of said second set.

15. A combination as defined in claim 14, wherein each signal conducting member of said second set belongs to at most two different pairs of non-contiguous signal conducting members of said second set.

16. A combination as defined in claim 15, wherein each signal conducting member of said first set is provided with a main connection path to a first signal conducting member of said second set and an alternate connection path to a second signal conducting member of said second set, said first and second signal conducting members of said second set being non-contiguous in said second set, said first signal conducting member of said second set being different for each signal conducting member of said first set, said second signal conducting member of said second set being different for each signal conducting member of said first set.

17. A combination as defined in claim 16, wherein said control mechanism is operative to select, for each signal conducting member of said first set, one of said main and alternate connection paths for establishing a signal connection between the signal conducting member of said first set and one of said first and second signal conducting members of said second set.

18. A combination as defined in claim 17, wherein, for each signal conducting member of said first set, said control mechanism is operative to activate one of said main and alternate connection paths and to deactivate the other of said main and alternate connection paths.

19. A combination as defined in claim 17, wherein, for each signal conducting member of said first set, said control mechanism is operative to permanently disconnect one of said main and alternate connection paths.

20. A combination as defined in claim 17, wherein said control mechanism is capable to test the signal conducting members of said second set for faults.

21. A combination as defined in claim 20, wherein said control mechanism includes a control logic circuit.

22. A combination as defined in claim 21, wherein said connector and said control mechanism are realized on a semiconductor body.

23. A combination as defined in claim 22, wherein the semiconductor body is a wafer.

24. A method for fabricating a connector, said method comprising:
a) realizing a first set of discrete signal conducting members at least in part on a first surface, the signal conducting members in said first set being arranged generally side by side;
b) realizing, remote from said first set of signal conducting members, a second set of discrete signal conducting members at least in part on a second surface, the signal conducting members in said second set being arranged generally side by side;
c) computing a layout of connection paths for interconnecting said first and second sets of discrete signal conducting members such that signals may be exchanged between signal conducting members of said first and second sets, said layout of connection paths providing each signal conducting member of said first set of signal conducting members with connection paths to a different pair of non-contiguous signal conducting members of said second set.

25. A method for fabricating a connector, said method comprising:
   a) realizing a first set of discrete signal conducting members at least in part on a first surface, the signal conducting members in said first set being arranged generally side by side;
   b) realizing, remote from said first set of signal conducting members, a second set of discrete signal conducting members at least in part on a second surface, the signal conducting members in said second set being arranged generally side by side according to a certain order, the certain order characterized by a series of positions;
   c) computing a layout of connection paths for interconnecting said first and second sets of discrete signal conducting members such that signals may be exchanged between signal conducting members of said first and second sets, said layout of connection paths providing each signal conducting member of said first set with a main connection path to a first signal conducting member of said second set and an alternate connection path to a second signal conducting member of said second set, the first and second signal conducting members of said second set occupying unsuccessive positions in said certain order, the first signal conducting member of said second set being different for each signal conducting member of said first set, the second signal conducting member of said second set being different for each signal conducting member of said first set.

26. A method as defined in claim 25, wherein the signal conducting members of said first set are arranged according to a first order and the signal conducting members of said second set are arranged according to a second order, said layout of connection paths for each signal conducting member of said first set being computed as follows:

For $1 \leq POS \geq N$
{
  MPOS=POS
  APOS=POS+2
}
where:
   POS is the position in the first order of the signal conducting member of the first set;
   MPOS is the position in the second order to which the main connection path is connected;
   APOS is the position in the second order to which the alternate connection path is connected.

27. A method for connecting a first set of discrete signal conducting members realized at least in part on a first surface to a second set of discrete signal conducting members realized at least in part on a second surface, the second set of discrete signal conducting members being remote from the first set of signal conducting members, the signal conducting members in the first set being arranged generally side by side according to a first order, the signal conducting members in the second set being arranged generally side by side according to a second order, each of the first and second orders characterized by a series of positions, said method comprising:
   a) computing a layout of connection paths for interconnecting the signal conducting members of the first and second sets, said layout of connection paths providing each signal conducting member of the first set with a main connection path to a first signal conducting member of the second set and an alternate connection path to a second signal conducting member of the second set, the first and second signal conducting members of the second set occupying unsuccessive positions in the second order, the first signal conducting member of said second set being different for each signal conducting member of said first set, the second signal conducting member of said second set being different for each signal conducting member of said first set;
   b) for each signal conducting member of the first set, testing each one of the first and second signal conducting members of the second set for a fault;
   c) for each signal conducting member of the first set, selecting one of the respective main and alternate connection paths on the basis of the testing at b, for connecting each signal conducting member of the first set to a single signal conducting member of the second set.

28. A method as defined in claim 27, wherein if no failures are detected, the main connection path is selected for each signal conducting member of the first set.

29. A method as defined in claim 28, wherein if, for a particular signal conducting member of the first set, a fault is detected in the first signal conducting member of the second set, said method includes:
   a) selecting the main connection path for each of the signal conducting members of the first set preceding the particular signal conducting member in the first order;
   b) selecting the alternate connection path for the particular signal conducting member;
   c) selecting the alternate connection path for each of the signal conducting members of the first set succeeding the particular signal conducting member in the first order.

30. A connector comprising:
   a) a first set of discrete signal conducting members realized at least in part on a first surface, the signal conducting members in said first set being arranged generally side by side;
   b) a second set of discrete signal conducting members realized at least in part on a second surface, said second set being remote from said first set, the signal conducting members in said second set being arranged generally side by side;
   c) a layout of connection paths for interconnecting said first and second sets of discrete signal conducting members such that signals may be exchanged between signal conducting members of said first and second sets, each signal conducting member of said first set being provided with connection paths to a different pair of non-contiguous signal conducting members of said second set;
   wherein each signal conducting member of said second set belongs to at most two different pairs of non-contiguous signal conducting members of said second set;
   wherein each signal conducting member of said first set is provided with a main connection path to a first signal conducting member of said second set and an alternate connection path to a second signal conducting member of said second set, said first and second signal conducting members of said second set being non-contiguous in said second set, said first signal conducting member of said second set being different for each signal conducting member of said first set, said second signal conducting member of said second set being different for each signal conducting member of said first set;

wherein the signal conducting members of said second set are arranged according to a certain order, the certain order characterized by a series of positions, each different pair of non-contiguous signal conducting members of said second set occupying a different pair of unsuccessive positions in said certain order; and wherein said first set of signal conducting members includes N signal conducting members and said second set of signal conducting member includes N+2 signal conducting members, said certain order being characterized by N+2 positions.

31. A connector as defined in claim 30, wherein when said first signal conducting member of said second set occupies position X in said certain order, said second signal conducting member of said second set occupies position X+2 in said certain order.

32. A connector as defined in claim 30, wherein the signal conducting members of said first set are arranged according to a first order and the signal conducting members of said second set are arranged according to a second order, the layout of the main and alternate connection paths for each signal conducting member of said first set being computed as follows:

for $1 \leq POS \geq N$
{
  MPOS=POS
  APOS=POS+2
} where:

POS is the position in the first order of the signal conducting member of the first set;

MPOS is the position in the second order to which the main connection path is connected;

APOS is the position in the second order to which the alternate connection path is connected.

33. A method for fabricating a connector, said method comprising:

a) realizing a first set of discrete signal conducting members at least in part on a first surface, the signal conducting members in said first set being arranged generally side by side;

b) realizing, remote from said first set of signal conducting members, a second set of discrete signal conducting members at least in part on a second surface, the signal conducting members in said second set being arranged generally side by side according to a certain order, the certain order characterized by a series of positions;

c) computing a layout of connection paths for interconnecting said first and second sets of discrete signal conducting members such that signals may be exchanged between signal conducting members of said first and second sets, said layout of connection paths providing each signal conducting member of said first set with a main connection path to a first signal conducting member of said second set and an alternate connection path to a second signal conducting member of said second set, the first and second signal conducting members of said second set occupying unsuccessive positions in said certain order, the first signal conducting member of said second set being different for each signal conducting member of said first set, the second signal conducting member of said second set being different for each signal conducting member of said first set;

wherein the signal conducting members of said first set are arranged according to a first order and the signal conducting members of said second set are arranged according to a second order, said layout of connection paths for each signal conducting member of said first set being computed as follows:

for $1 \leq POS \geq N$
{
  MPOS=POS
  APOS=POS+2
} where:

POS is the position in the first order of the signal conducting member of the first set;

MPOS is the position in the second order to which the main connection path is connected; and APOS is the position in the second order to which the alternate connection path is connected.

34. A connector as defined in claim 1, wherein said second set contains fewer than twice as many signal conducting members as said first set.

35. A method as defined in claim 27, wherein after said selecting, at least one of the signal conducting members of said second set remains unconnected to any of the signal conducting members of said first set.

* * * * *